US012648381B2

(12) United States Patent
Fan et al.

(10) Patent No.: US 12,648,381 B2
(45) Date of Patent: Jun. 2, 2026

(54) METAL ETCH

(71) Applicant: Lam Research Corporation, Fremont, CA (US)

(72) Inventors: Yiwen Fan, Fremont, CA (US); Wenbing Yang, Campbell, CA (US); Ran Lin, Fremont, CA (US); Samantha SiamHwa Tan, Newark, CA (US); Timothy William Weidman, Sunnyvale, CA (US); Tamal Mukherjee, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 203 days.

(21) Appl. No.: 18/257,085

(22) PCT Filed: Dec. 6, 2021

(86) PCT No.: PCT/US2021/062036
§ 371 (c)(1),
(2) Date: Jun. 12, 2023

(87) PCT Pub. No.: WO2022/154901
PCT Pub. Date: Jul. 21, 2022

(65) Prior Publication Data
US 2024/0021435 A1 Jan. 18, 2024

Related U.S. Application Data

(60) Provisional application No. 63/138,263, filed on Jan. 15, 2021.

(51) Int. Cl.
*H10P 50/26* (2026.01)
*C23F 1/00* (2006.01)
(Continued)

(52) U.S. Cl.
CPC .............. *H10P 50/267* (2026.01); *C23F 1/00* (2013.01); *C23F 1/12* (2013.01); *H10B 61/00* (2023.02);
(Continued)

(58) Field of Classification Search
None
See application file for complete search history.

(56) References Cited

U.S. PATENT DOCUMENTS

| | | | |
|---|---|---|---|
| 5,814,238 A | * | 9/1998 | Ashby ....................... C23F 4/00 216/75 |
| 8,608,973 B1 | | 12/2013 | Guha |

(Continued)

FOREIGN PATENT DOCUMENTS

| | | |
|---|---|---|
| JP | 04-208526 | 7/1992 |
| JP | 2011-190490 | 9/2011 |

(Continued)

OTHER PUBLICATIONS

Lii-Rosales et al., "Volatile products from ligand addition of P(CH3)3 to NiCl2, PdCl2 and PtCl2: pathway for metal thermal atomic layer etching", J. Phys. Chem. C, vol. 126, pp. 8287-8295. (Year: 2022).*

(Continued)

*Primary Examiner* — Jiong-Ping Lu
(74) *Attorney, Agent, or Firm* — Beyer Law Group LLP

(57) ABSTRACT

A method for etching a metal containing material is provided. The metal containing material is exposed to a halogen containing fluid or plasma to convert at least some of the metal containing material into a metal halide material. The metal halide material is exposed to a ligand containing fluid or plasma, wherein at least some of the metal halide material is formed into a metal halide ligand complex. At least some of the metal halide ligand complex is vaporized.

19 Claims, 7 Drawing Sheets

(51) Int. Cl.

| | |
|---|---|
| *C23F 1/12* | (2006.01) |
| *H10B 61/00* | (2023.01) |
| *H10P 50/24* | (2026.01) |
| *H10P 50/28* | (2026.01) |

(52) U.S. Cl.
CPC .......... *H10P 50/242* (2026.01); *H10P 50/266* (2026.01); *H10P 50/283* (2026.01)

(56)                 References Cited

U.S. PATENT DOCUMENTS

| | | | |
|---|---|---|---|
| 9,882,124 B2 | 1/2018 | Nishimura et al. | |
| 10,002,772 B2 * | 6/2018 | Hendrix ............ | H01L 21/31122 |
| 10,242,885 B2 | 3/2019 | Anthis et al. | |
| 2016/0032460 A1 | 2/2016 | Schmiege et al. | |
| 2017/0229317 A1 * | 8/2017 | Shen ................. | H01L 21/32135 |
| 2018/0182634 A1 * | 6/2018 | Smith ............... | H01J 37/32899 |
| 2018/0342403 A1 | 11/2018 | Anthis et al. | |
| 2019/0312194 A1 | 10/2019 | Tan et al. | |
| 2020/0312620 A1 | 10/2020 | Blomberg et al. | |
| 2020/0312670 A1 | 10/2020 | Smith et al. | |
| 2025/0037970 A1 | 1/2025 | Blomberg et al. | |

FOREIGN PATENT DOCUMENTS

| | | |
|---|---|---|
| JP | 2015-192150 | 11/2015 |
| KR | 10-2018-0073459 | 7/2018 |
| KR | 10-2019-0090406 | 8/2019 |
| KR | 10-2020-0001603 | 1/2020 |

OTHER PUBLICATIONS

Konh et al., "Molecular mechanism of thermal dry etching of iron in a two-step atomic layer etching process: chlorination followed by exposure to acetylacetone", J. Phys. Chem. C, vol. 125, pp. 7142-7154 (Year: 2021).*
Lee et al., "Selectivity in thermal atomic layer etching using sequential, self-limiting fluorination and ligand-exchange reactions", Chem of Materials, vol. 28, pp. 7657-7665. (Year: 2016).*
International Search Report and Written Opinion from International Application No. PCT/US2021/062036 dated Mar. 25, 2022.
Notice of Reason of Refusal from Japanese Application 2023-541869 dated Jun. 24, 2025 with Machine Translation.
Korean Office Action from Korean Application No. 10-2023-7027528 dated May 20, 2025 with Machine Translation.
Taiwanese Office Action from Taiwanese Application No. 111101060 dated Aug. 7, 2025 with Machine Translation.

\* cited by examiner

START

FORM METAL HALIDE
104

FORM METAL HALIDE LIGAND COMPLEX
108

VAPORIZE METAL HALIDE LIGAND COMPLEX
112

STOP

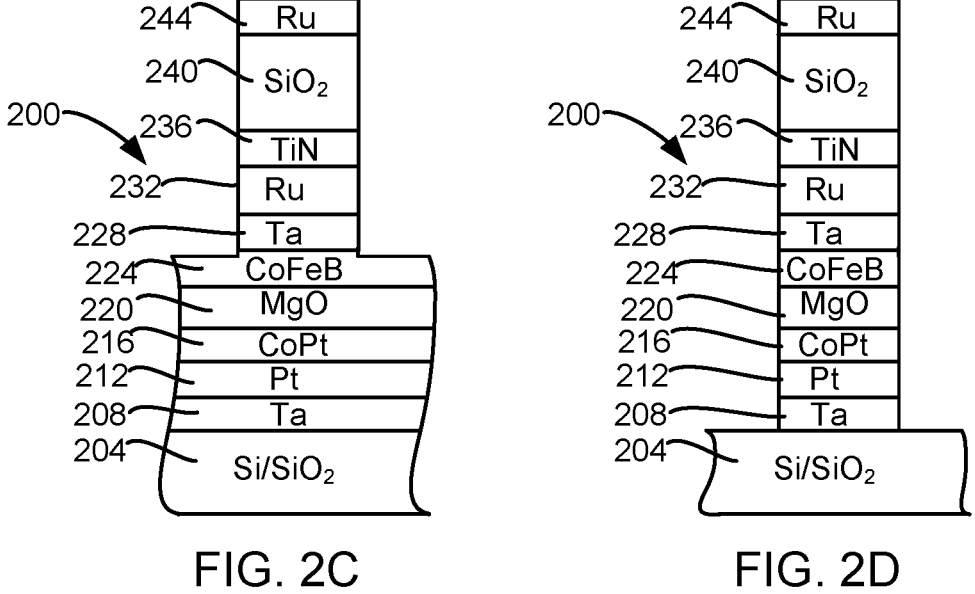
FIG. 2C                    FIG. 2D

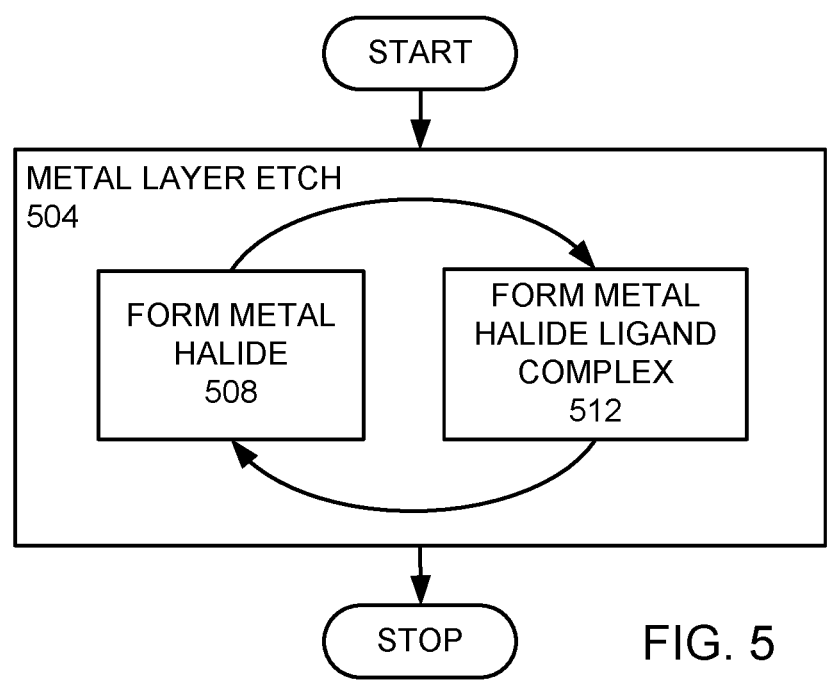
FIG. 5
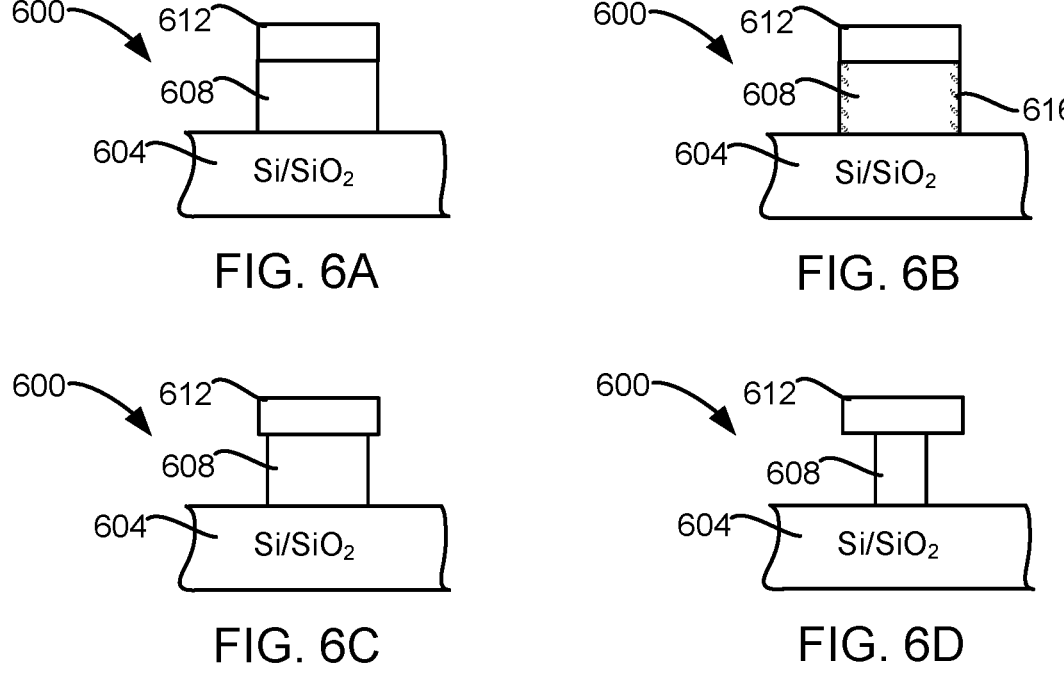
FIG. 6A
FIG. 6B
FIG. 6C
FIG. 6D

METAL ETCH

CROSS-REFERENCE TO RELATED APPLICATION

This application claims the benefit of priority of U.S. Application No. 63/138,263, filed Jan. 15, 2021, which is incorporated herein by reference for all purposes.

BACKGROUND

The background description provided here is for the purpose of generally presenting the context of the present disclosure. Anything described in this background section, and potentially aspects of the written description, are not expressly or impliedly admitted as prior art with respect to the present application.

The disclosure relates to a method of forming semiconductor devices on a semiconductor wafer. More specifically, the disclosure relates to the selective etching of semiconductor devices.

In forming semiconductor devices, magnetic random access memory (MRAM) may be formed using a pattern transfer process. Such a pattern transfer process uses an etch process. The MRAM stack contains non-volatile and ferromagnetic materials such as cobalt (Co), iron (Fe), manganese (Mn), nickel (Ni), platinum (Pt), palladium (Pd), and ruthenium (Ru). These materials are extremely difficult to pattern without using complicated approaches with ion beam etching (IBE), reactive ion etching (RIE), and wet chemistries. Despite many years of development, current patterning technologies still suffer from many drawbacks such as sidewall re-deposition causing tapered profiles and shorting of a magnetic tunnel junction (MTJ) to a fixed layer, and corrosion causing MTJ layer damage. In some conventional techniques, a chlorine-containing chemistry is used to etch metal, but the etched byproducts include non-volatile compounds. The non-volatile compounds may subsequently re-deposit onto the sidewalls of the feature. However, as devices shrink and fabrication of various types of structures become more complex, some etched byproducts may re-deposit onto other exposed regions of a substrate. The redeposited byproducts may cause defects and eventual device failure.

For large critical dimension (CD) structures with wide pitch, a single-step or multi-step IBE recipe may be sufficient. But for small CD or tight pitch features of sub-100 nm, patterning with IBE is difficult. A fundamental limitation is the ion incidence shadowed by a mask. This limitation prevents effective MRAM stack etch and trim.

SUMMARY

To achieve the foregoing and in accordance with the purpose of the present disclosure, a method for etching a metal containing material is provided. The metal containing material is exposed to a halogen containing fluid or plasma to convert at least some of the metal containing material into a metal halide material. The metal halide material is exposed to a ligand containing fluid or plasma, wherein at least some of the metal halide material is formed into a metal halide ligand complex. At least some of the metal halide ligand complex is vaporized.

In another manifestation, a method for etching a metal containing material is provided. The metal containing material is exposed to an etching fluid or plasma comprising phosphorous and chlorine to form the metal into at least one complex of a metal phosphorous chloride ligand complex. At least some of the metal phosphorous chloride ligand complex is vaporized.

These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 2A-D are schematic cross-sectional views of a stack processed according to an embodiment.

FIG. 5 is a flow chart of an atomic layer etch.

FIGS. 6A-D is a schematic cross-sectional view of a stack processed in another embodiment.

DETAILED DESCRIPTION OF THE PREFERRED EMBODIMENTS

Figure 1:
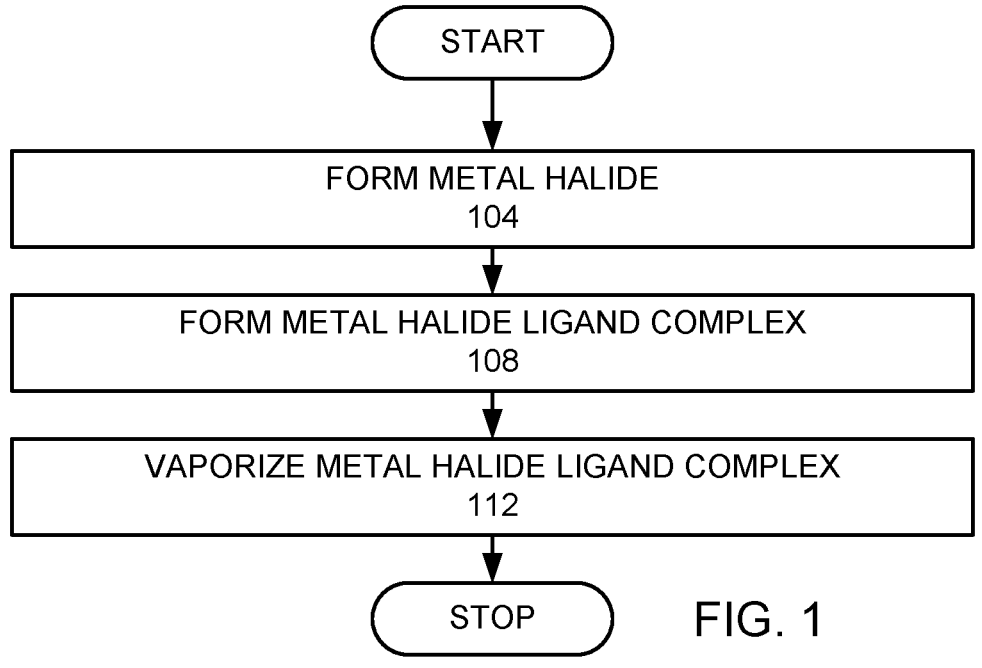
FIG. 1 is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

During semiconductor wafer processing, features may be etched through a metal containing layer. In the formation of magnetic random access memories (MRAM), a plurality of thin metal containing layers or films may be sequentially etched to form magnetic tunnel junction stacks.

A magnetic tunnel junction (MTJ) is composed of a thin dielectric barrier layer between two magnetic materials. Electrons pass through the barrier by the process of quantum tunneling. This can serve as a basis for magnetic-based memory, using a spin-transfer torque.

The spin-transfer torque is an effect in which the orientation of a magnetic layer in an MTJ can be modified using a spin-polarized current. Charge carriers (e.g., electrons) have a property known as spin. Spin is a small quantity of angular momentum intrinsic to the carrier. An electrical current is generally unpolarized (50% spin-up and 50% spin-down electrons). By passing a current through a thick magnetic layer (usually called the "fixed layer"), a spin polarized current, with more electrons of either spin can be produced. If this spin-polarized current is directed into a second, thinner magnetic layer (the "free layer"), angular momentum can be transferred to this layer, changing its orientation. This effect can be used to excite oscillations or even flip the orientation of the magnet.

Spin-transfer torque can be used to flip the active elements in magnetic random-access memory. Spin-transfer torque magnetic random-access memory (STT-RAM or STT-MRAM) has the advantages of lower power consumption and better scalability over conventional MRAM. MRAM uses magnetic fields to flip the active elements.

STT-RAM device patterning has been demonstrated via either reactive ion etch followed by ion beam etch (IBE); or by a full inert-gas angular IBE strategy. The Reactive ion etch (RIE) process normally results in a tapered profile and heavy sidewall re-deposition of etch byproducts. Moreover, the chemical damages to magnesium oxide (MgO) layers limit RIE only processes for MRAM patterning.

The IBE technique is developed for MRAM pattern transfer while minimizing MTJ damage caused by reactive species. A common approach is to first implement IBE at normal incidence to shape the MTJ and minimize footing and then remove re-deposition from the initial step by providing a sidewall clean by providing IBE at a grazing incidence. Since IBE relies on the sputter of inert ions, sidewall re-deposition exists during pattern transfer. IBE and oxidation cycles were generally implemented to remove shorting pathways and stop on the MgO tunnel barrier, preserving a pristine and continuous free layer for spin transport.

Methods of plasma dry etching MRAM stacks are described in "Dry Plasma Etch Method to Pattern MRAM Stack," by Tan et al., U.S. Pat. No. 9,806,252, issued Oct. 31, 2017, which is incorporated by reference for all purposes. Methods for providing an ion beam etch are described in, "Ion Beam Etching System," by Singh et al, U.S. Pat. No. 9,257,295, issued Feb. 9, 2016, which is incorporated by reference for all purposes.

For large critical dimension (CD) structures with wide pitch, a single-step or multi-step IBE recipe may be sufficient. But for small CD or tight pitch features of sub-100 nm, patterning with IBE is difficult. A fundamental limitation is the ion incidence shadowed by a mask. This limitation prevents effective MRAM stack etch and trim.

Figure 2A:
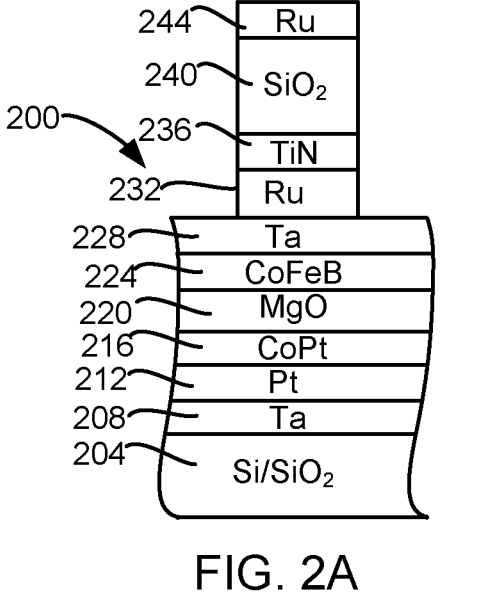

To facilitate understanding, FIG. 1 is a high level flow chart illustrating processes used for etching metal containing layers in an embodiment. Various embodiments may have more or less steps. In addition, in various embodiments, the steps may be performed in different orders or simultaneously. Metal in a metal containing layer is formed into a metal halide (step 104). The metal may be any possible metal in any possible stack. In an embodiment, the metal containing layer is part of an MRAM stack. FIG. 2A is a schematic cross-sectional view of an example stack 200 that can be processed using the processes shown in FIG. 1. The stack 200 is on a substrate with a silicon or silicon oxide (Si/SiO$_2$) layer 204. A first tantalum (Ta) layer 208 is over the Si/SiO$_2$ layer 204. A platinum (Pt) layer 212 is over the first Ta layer 208. A cobalt platinum alloy (CoPt) layer 216 is over the Pt layer 212. A magnesium oxide (MgO) layer 220 is over the CoPt layer 216. A cobalt iron boron (CoFeB) layer 224 is over the MgO layer 220. A second Ta layer 228 is over the CoFeB layer 224. A ruthenium (Ru) layer 232 is over the second Ta layer 228. A patterned mask is formed over the stack 200. In this embodiment, the patterned mask comprises a titanium nitride layer 236, under a SiO$_2$ layer 240, under a Ru layer 244. In this embodiment, an optional Ru layer 244 opening etch is provided before the metal containing layer etch. The Ru layer 244 opening etch is provided using an oxygen containing plasma. In addition, the Ru layer 232 of the MRAM stack 200 has been etched using a conventional oxygen etch process.

Figure 3:
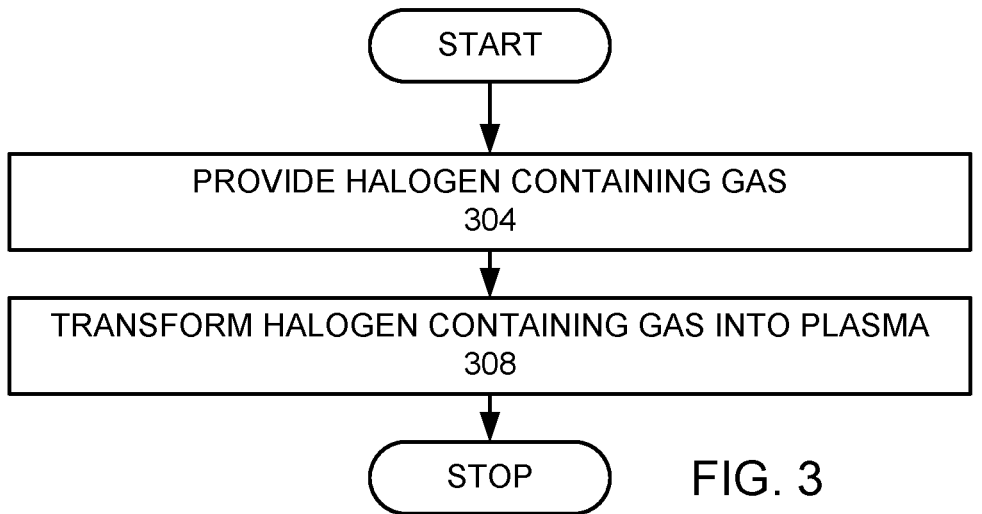
FIG. 3 is a more detailed flow chart of a step of transforming metal in a metal containing layer into a metal halide.

FIG. 3 is a flow chart showing example details of forming metal in a metal containing layer into a metal halide (step 104). In various embodiments, the forming metal in a metal containing layer into a metal halide (step 104) may be performed differently than the process shown in FIG. 3, such as by adding or omitting steps from FIG. 3 or by performing steps in a different order or simultaneously. A halogen containing gas is provided (step 304). In this embodiment, the halogen containing gas is chlorine gas (Cl$_2$). In an embodiment, the flow of the Cl$_2$ gas may be in the range of 10 sccm to 500 sccm. In other embodiments, the halogen containing gas may comprise at least one of nitrogen trifluoride (NF$_3$), hydrogen bromide (HBr), boron trichloride (BCl$_3$), bromine (Br$_2$), sulfur hexafluoride (SF$_6$), and phosphorus trichloride (PCl$_3$). The halogen containing gas is transformed into a halogen containing plasma (step 308). As some example conditions, the plasma may be generated using a plasma power between about 100 (watts) W and 900 W. The temperature during this operation may be between about 60° C. and about 200° C. The chamber pressure during this operation may be between about 1 millitorr (mTorr) and about 500 mTorr.

The stack 200 is exposed to the halogen containing plasma. In this embodiment, the chlorine containing plasma is able to etch the second Ta layer 228. When the second Ta layer 228 is etched away, parts of the CoFeB layer 224 are exposed to the chlorine containing plasma. The chlorine containing plasma is not able to etch the CoFeB layer 224 but instead forms a chloride with the cobalt and iron according to the equation: $M + xCl \rightarrow Cl_x$, where M is a metal and x is an integer.

Figure 2B:
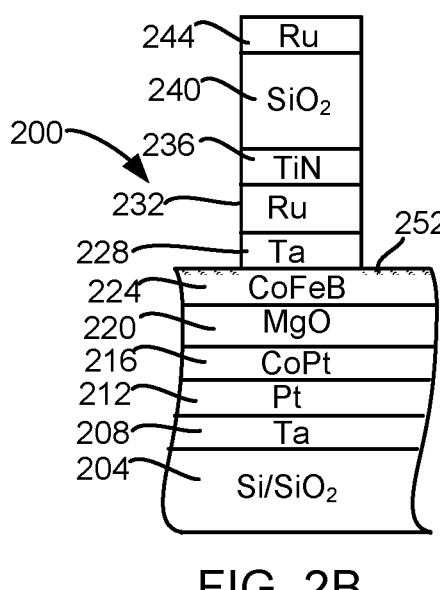

Table 1 provides an example of metal halides that may be formed in some of the embodiments. In this embodiment, the metal halides that may be formed are iron (II) chloride (FeCl$_2$), ferric chloride (FeCl$_3$), and cobalt (II) chloride (CoCl$_2$). The melting points for the metal halides in Table 1 range from 304° C. to 1170° C. These melting points are above the process temperature in this embodiment. It would be undesirable to subject the stack 200 to many of these melting point temperatures. FIG. 2B is a schematic cross-sectional view of an example stack 200 after the chlorine containing plasma has etched away part of the second Ta layer 228 and formed part of the CoFeB layer 224 into cobalt chloride and iron chlorides, providing cobalt chloride and iron chloride regions 252, indicated by shading.

TABLE 1

| Metal chlorides and bromides | Melting point (° C.) |
|---|---|
| FeCl$_2$ | 667 |
| FeCl$_3$ | 304 |
| CoCl$_2$ | 470 |
| CoBr$_2$ | 678 |
| FeBr$_2$ | 691 |
| NiBr$_2$ | 963 |
| CrCl$_2$ | 814 |
| InF$_3$ | 1170 |

Figure 4:
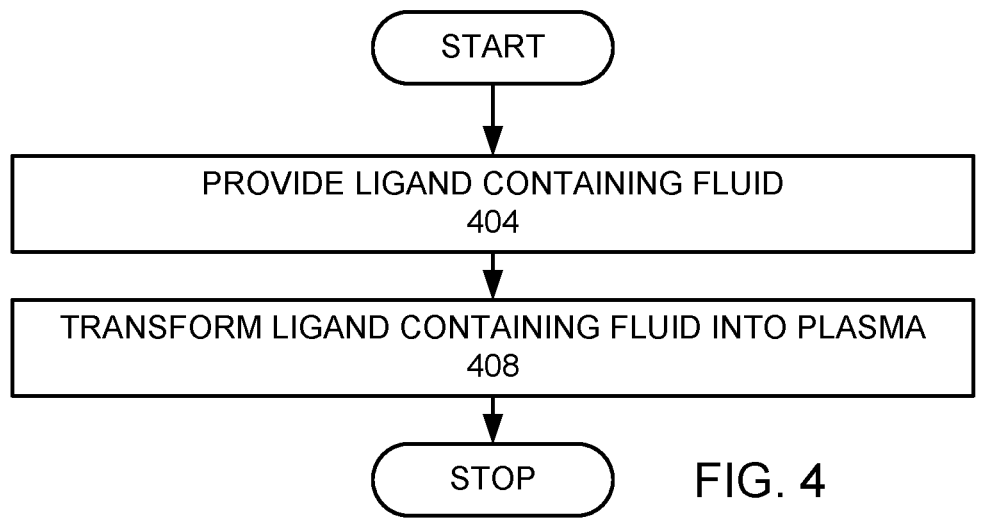
FIG. 4 is a more detailed flow chart of the step of transforming metal halide into a metal halide ligand complex.

After the formation of metal halides is formed, the metal halide material is exposed to a ligand containing plasma, where at least some of the metal halide is formed into a metal halide ligand complex (step 108). FIG. 4 is a flow chart showing example details of forming a metal halide into a metal halide ligand complex (step 108). The forming the metal halide into a metal halide ligand complex (step 108) may be performed differently, for example, such as adding or omitting steps from FIG. 4 or performing steps in a different order or simultaneously. A ligand containing fluid is provided (step 404). In this embodiment, the ligand containing fluid is water ($H_2O$) vapor. In an embodiment, the flow of the water vapor may be in the range of 10 sccm to 500 sccm. In other embodiments, the ligand containing fluid may comprise at least one of carbon monoxide (CO), carbon dioxide ($CO_2$), hydroxide (OH), and ammonia ($NH_3$). The ligand containing fluid may be a gas or liquid. The liquid may be a vapor. The ligand containing fluid is transformed into a ligand containing plasma (step 408). As some example conditions, the plasma may be generated using a plasma power between about 100 W and 900 W. The temperature during this operation may be between about 60° C. and about 200° C. The chamber pressure during this operation may be between about 1 mTorr and about 500 mTorr.

The stack 200 is exposed to the ligand containing plasma. The ligand containing plasma forms the metal halides into a metal halide ligand complex according to the equation: $MCl_x + yH_2O \rightarrow MCl_x \cdot yH_2O$, where y is an integer. In other embodiments, the metal halide ligand complex is formed without transforming the ligand containing vapor into a plasma.

In this embodiment, the metal halide ligand complexes that may be formed are iron (III) chloride hexahydrate ($FeCl_3 \cdot 6H_2O$) with a melting point of about 37° C. and iron tetracarbonyl hydride ($FeH_2(CO)_4$) with a melting point of about −70° C. The melting points or vaporization temperatures of the metal halide ligand complexes are below the process temperature in this embodiment. Providing a process temperature above the melting point of the metal halide ligand complexes and a pressure in the range of about 1 millitorr (mTorr) and about 500 mTorr results in a liquid metal halide ligand complex that is vaporized (step 112). In some embodiments, the pressure is provided in the range of 1 mTorr to 50 mTorr. FIG. 2C is a schematic cross-sectional view of an example stack 200 after converting metal halides to metal halide ligand complexes that are vaporized, resulting in etching part of the CoFeB layer 224.

In one embodiment, the forming the metal halide by exposure of the metal containing material to the halogen containing plasma (step 104), the forming the metal halide ligand complex by exposing the metal halide to the ligand containing plasma (step 108), and vaporizing the metal halide ligand complex (step 112) are provided simultaneously in a continuous single step etch process. In another embodiment, the forming of the metal halide by exposure of the metal containing material to the halogen containing plasma (step 104) and the forming the metal halide ligand complex by exposing the metal halide to the ligand containing plasma (step 108) are performed in a sequentially and/or cyclically providing an atomic layer etch (ALE) process. FIG. 5 is a flow chart of an atomic layer etch 504. Various embodiments may have more or less steps. In addition, the steps may be performed in different orders or simultaneously. In this embodiment, each atomic layer etch cycle comprises a metal halide formation step (step 508) and a metal halide ligand complex formation step (step 512). In this embodiment, the substrate is heated to a temperature of above 120° C., so that the metal halide ligand complex is vaporized during the metal halide ligand complex formation step (step 512). In other embodiments, the substrate is heated to a temperature above about 100° C. Such an atomic layer etch may be slower than a single step process but may provide a more controlled and conformal etch process.

If the etch is performed as a single step where the forming the metal halide by exposure of the metal containing material to the halogen containing plasma (step 104), the forming the metal halide ligand complex by exposing the metal halide to the ligand containing plasma (step 108), and vaporizing the metal halide ligand complex (step 112) are provided simultaneously providing a continuous single step etch process, after a period of time the stack 200 is etched. If the etch is an atomic layer etch sequentially providing a plurality of cycles where each cycle comprises the metal halide formation step (step 508) and the metal halide ligand complex formation step (step 512), the cycles are repeated until the stack 200 is etched. However, for etching the first Ta layer 208 or the second Ta layer 228, a single step of forming a metal halide without converting the metal halide into a metal halide ligand complex may be provided. This is because some tantalum halides have a boiling point that is lower than the processing temperatures. As a result, the tantalum halide may be vaporized without forming the tantalum halide into a tantalum halide ligand complex.

In this embodiment, the etch was used providing a directional patterned etch of a stack 200 under a hardmask. The sidewalls of the stack 200 may be less tapered than an etch using an ion beam etch. For an ion beam etch, the ion beam is provided in a non-vertical direction. The non-vertical direction of the ion beam etch causes tapered sidewalls of the resulting stack. In these embodiments, the stack 200 is an MRAM stack. However, the various processes described herein can also be used to etch other types of devices, particular devices with a stack structure including magnetic materials. Examples may include but are not limited to the formation of cobalt or ruthenium interconnects.

In another embodiment, an isotropic etch is provided. To facilitate understanding, FIG. 6A is a schematic cross-sectional view of a stack 600 used in an embodiment. The stack 600 comprises a substrate 604 under a metal containing layer 608 under a hardmask 612. In this example, the substrate is silicon or silicon oxide ($Si/SiO_2$). In this embodiment, the metal containing layer 608 is cobalt (Co) and the hardmask 612 is ruthenium (Ru). In this embodiment, an ALE process is used. In this embodiment, some of the Co is converted into a metal halide (step 104). In this embodiment, the stack 600 is exposed to a plasma formed from a $Br_2$ gas. The plasma reacts with the cobalt to form a metal halide according to the equation: $Co + Br_2 \rightarrow CoBr_2$. FIG. 6B is a schematic view of the stack 600 after the stack 600 is exposed to the plasma to form a metal halide layer 616 of $CoBr_2$.

After the exposure of the stack 600 to the halogen plasma is stopped, the stack 600 is exposed to a ligand containing plasma to form a metal halide ligand complex (step 108). In this embodiment, the metal halide is formed into a metal halide hydride according to an example equation $CoBr_2 + yH_2O \rightarrow CoBr_2 \cdot yH_2O$. The metal halide ligand complex is vaporized (step 112). FIG. 6C is a schematic view of the stack 600 after the stack 600 is exposed to the plasma to form a metal halide ligand complex layer that is vaporized. The metal containing layer 608 is partially horizontally or laterally etched.

The atomic layer etch process may be repeated for one or more cycles until the metal containing layer 608 is etched a desired amount. FIG. 6D is a schematic view of the stack 600 after a plurality of atomic layer etch cycles providing a completed lateral etch of the metal containing layer 608. A controlled lateral etch of the metal containing layer 608 allows a controlled thinning of the metal containing layer 608. Using an atomic layer etch process reduces aspect ratio dependence and variation of the etch with respect to depth. Atomic layer etching also reduces chemical damage, since ALE cycling halogen and Ar sputter minimizes halogen exposure. For an MRAM stack, minimizing MgO layer damage is critical to avoiding degradation of electrical properties of the MRAM stack.

Figure 7:
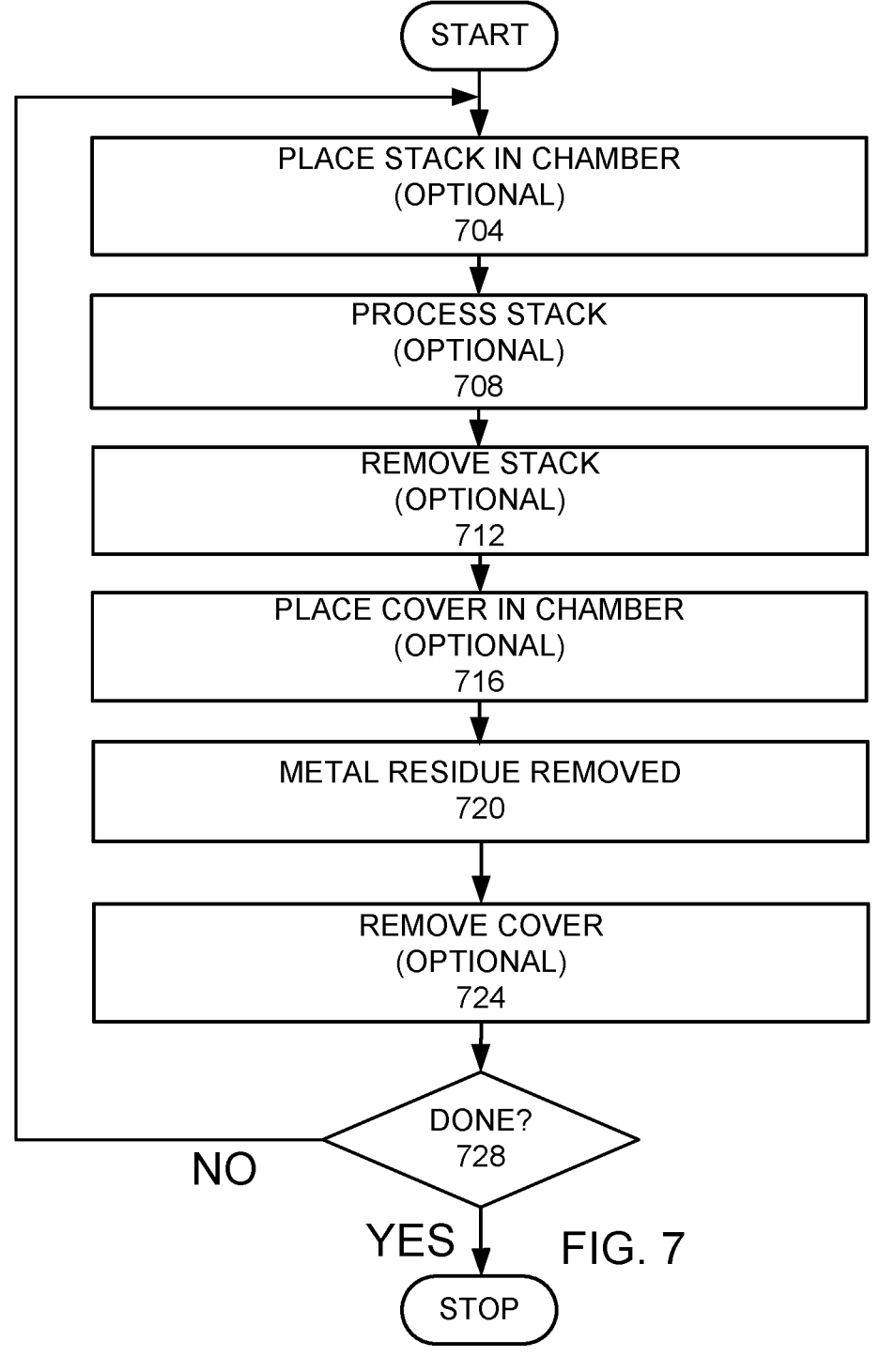
FIG. 7 is a high level flow chart where the metal etch process is used to etch metal residue in a plasma processing chamber.

Another embodiment may be used for cleaning metal residue inside a plasma processing chamber. To facilitate understanding, FIG. 7 is a high level flow chart where the metal etch process is used to etch metal residue in a plasma processing chamber. Various embodiments may have more or less steps. In addition, the steps may be performed in different orders or simultaneously. In this embodiment, a process wafer with a stack is placed in a plasma processing chamber (step 704). The wafer and stack may be the stack 200 shown in FIG. 2A or may be another metal containing stack. The stack is processed (step 708). For example, the stack may be subjected to one or more processes. The stack may be subjected to an ion beam etch or another etch that causes metal containing residue to be deposited in the interior of the plasma processing chamber. A deposition process may also form metal containing residue. The stack is removed from the plasma processing chamber (step 712).

A cover is placed over a substrate support in the plasma processing chamber (step 716). The cover may be a wafer. In some embodiments, a cover is not placed over the substrate support. The metal residue is removed from the interior of the plasma process (step 720). In this embodiment, the removal of the residue is performed by simultaneously exposing the metal containing material of the metal containing residue to a halogen containing plasma to convert at least some of the metal containing material of the metal containing residue into a metal halide (step 104), exposing the metal halide material to a ligand containing plasma to convert at least some of the metal halide into a metal halide ligand complex (step 108), and vaporizing at least some of the metal halide ligand complex (step 112) in a single continuous process. The process removes various types of metal. Additional chamber cleaning processes may be used before or after the metal removal of the metal containing residue. The cover is removed (step 724). A determination is then made on whether or not to process another stack (step 728). If another stack is to be processed, then the process returns to the step of placing a stack in a plasma processing chamber (step 704).

This embodiment is able to remove many different metal residues exposed to a plasma without requiring an ion beam. As a result, this embodiment is able to remove many different metal residues from all plasma facing surfaces of the plasma processing chamber. An embodiment is able to use a single cleaning step to remove residues of Fe, Ni, Cr, In, Pt, Pd, Ta, Ti, Mg, W, Mo, Hf, Al, and Co. As a result, the different residues may be removed quickly. In some embodiments, a separate step of providing an oxygen containing plasma may be provided to remove Ru containing residues. In addition, this embodiment is able to remove metal residues from all surfaces exposed to the cleaning plasma. For ion beam cleaning, only surfaces impinged by the ion beam are cleaned.

In various embodiments, the metal etch may be used in other applications in addition to vertical pattern etching below a mask, horizontal or isotropic etching, and chamber cleaning. For example, when metal deposition fills in a pattern and forms an overburden layer, a recess etch is needed to remove the overburden and an etch back is used to etch back into the pattern.

Other metal containing residues may be etched in various embodiments. An example of such reactions used in various embodiments provides a first reaction where halogen combines with a metal or metal oxide to form a metal halide (step 104). An example equation would be:

$$M + xCl \rightarrow MCl_x \qquad (1).$$

Other halogens, such as F, Br, and I may be used in place of chlorine (Cl). The metal halide is formed into a metal halide ligand complex (step 108). In some embodiments, the metal halide is formed into a metal halide ligand complex that is a metal halide hydride byproduct, according to the equation:

$$MCl_x + yH_2O \rightarrow MCl_x yH_2O \qquad (2)$$

In some embodiments, the metal halide is formed into a metal halide ligand complex that is a volatile metal halide carbonyl byproduct according to the equation:

$$MCl_x + yCO + xH \rightarrow MH_x yCO + xCl \qquad (2)$$

In such embodiments, the hydrogen partially is replaced with CO. The metal halide ligand complex is then vaporized (step 112). In some embodiments, ammonia is added to the ligand containing fluid with carbon dioxide or carbon monoxide to facilitate the formation of metal halide carbonyl volatile byproduct. The ammonia helps to generate more CO radicals.

In other embodiments, a phosphorus (P) containing ligand may be used. In an embodiment, a metal is formed into a metal halide (step 104), using fluorine according to the equation, $M + xF \rightarrow MF_x$. The metal halide is formed into a metal halide ligand complex (step 108). In this example, the ligand contains phosphorous according to the equation, $MF_x + yPCl_3 \rightarrow MCl_x(PF_3)_y$. The metal halide ligand complex is then vaporized (step 112). In some embodiments, the metal M may be ruthenium.

Phosphorous pentachloride ($PCl_5$) forms relatively stable and volatile complexes of transition metals. Like carbon monoxide (CO) and to a slightly lesser extent than phosphorous trichloride ($PF_3$), $PCl_5$ exhibits a strong pi-back-bonding character capable of stabilizing many low valent late transition metal compounds. $PCl_5$ is a volatile liquid at room temperature with a boiling point of 166° C. $PCl_5$ is a volatile solid that sublimes around 160° C. Both can be delivered either as pure vapors or entrained in a flow of inert carrier gas. $PCl_5$ can react directly with metal surfaces (with or without plasma activation) to generate volatile metal phosphorous chloride ligand complexes, in the form of $M(PCl_3)xCl_2$ complexes, where M is a metal and x is an integer between 1 and 6 inclusive. Therefore, the metal layer may be exposed either to a $PCl_5$ fluid (liquid or gas) or to a plasma formed from $PCl_5$ in order to transform metal into a metal halide. In some embodiments, the metal M may be ruthenium. Similarly, with plasma activation, later transition metals can react with $PCl_3$ to form volatile byproducts, i.e., $Ni + PCl_3 \rightarrow Ni(PCl_3)_4$.

In another embodiment, an ALE process has a first step where metals are formed into a metal halide that is a metal fluoride (step 104). One example of a halogen containing gas would be nitrogen trifluoride ($NF_3$). The equation for a first step of the ALE process would be:

Step 1: M(metal to be etched)+$NF_3$ (direct or remote plasma activation) $\rightarrow MF_x$ For the second step of the ALE process in this embodiment, the ligand containing fluid comprises $PCl_3$. Phosphorus has a high affinity for fluorine, and $PCl_3$ reacts with many metal fluorides to produce $PF_3$ gas and the corresponding metal chlorides. Since $PF_3$ (or $PF_{3-x}Cl_x$ with x=1 or 2) promotes the formation of even more stable and volatile metal complexes, this enables atomic layer etch (ALE) sequences as exemplified by the following:

Step 2: $MF_x+PCl_3 \rightarrow MCl_x(PF_3)_y$ (volatile etch byproducts).

In various embodiments, the stack 200 may be a stack for MRAM. In various embodiments, the stack 200 may be a magnetic tunnel junction (MTJ) composed of a thin dielectric barrier layer between two magnetic materials. In various embodiments, the stack 200 comprises at least one metal containing layer. The metal containing layer may comprise at least one of Cr, Mo, Ir, Ti, Ru, Mn, Ni, Pd, Ta, Co, Fe, Mg, and Pt. In an example, the stack comprises at least one layer of MgO. Other stacks may have other transition metals in the 1st, 2nd, and 3rd rows (e.g., Group IV transition metals, Group V transition metals, and Group VI transition metals), including metals such as Cu.

Figure 8:
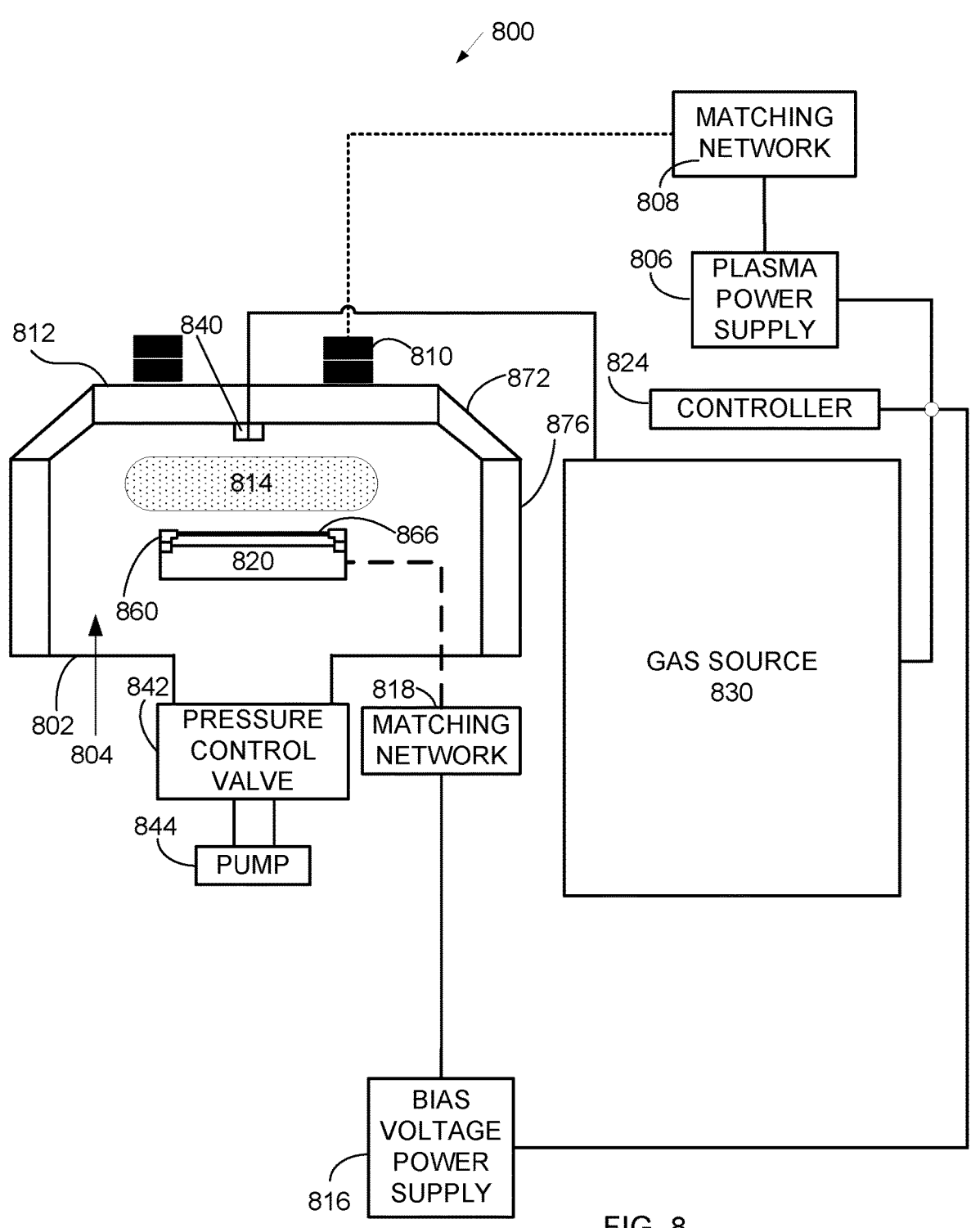
FIG. 8 is a schematic view of a plasma processing chamber that may be used in an embodiment.

To provide an embodiment of a processing chamber that may be used in an embodiment, FIG. 8 schematically illustrates an example of a plasma processing chamber system 800 that may be used for the plasma processing process. The plasma processing chamber system 800 includes a plasma reactor 802 having a plasma processing confinement chamber 804 therein. A plasma power supply 806, tuned by a plasma matching network 808, supplies power to a transformer coupled plasma (TCP) coil 810 located near a dielectric inductive power window 812 to create a plasma 814 in the plasma processing confinement chamber 804 by providing an inductively coupled power. A pinnacle 872 extends from a chamber wall 876 of the plasma processing confinement chamber 804 to the dielectric inductive power window 812 forming a pinnacle ring. The pinnacle 872 is angled with respect to the chamber wall 876 and the dielectric inductive power window 812, such that the interior angle between the pinnacle 872 and the chamber wall 876 and the interior angle between the pinnacle 872 and the dielectric inductive power window 812 are each greater than 90° and less than 180°. The pinnacle 872 provides an angled ring near the top of the plasma processing confinement chamber 804, as shown.

The TCP coil (upper power source) 810 may be configured to produce a uniform diffusion profile within the plasma processing confinement chamber 804. For example, the TCP coil 810 may be configured to generate a toroidal power distribution in the plasma 814. The dielectric inductive power window 812 is provided to separate the TCP coil 810 from the plasma processing confinement chamber 804 while allowing energy to pass from the TCP coil 810 to the plasma processing confinement chamber 804. The TCP coil 810 act as an electrode for providing radio frequency (RF) power to the plasma processing confinement chamber 804. A wafer bias voltage power supply 816 tuned by a bias matching network 818 provides power to an electrode 820 to set the bias voltage on the substrate 866. The substrate 866 is supported by the electrode 820 so that the electrode acts as a substrate support. A controller 824 controls the plasma power supply 806 and the wafer bias voltage power supply 816.

The plasma power supply 806 and the wafer bias voltage power supply 816 may be configured to operate at specific radio frequencies such as, for example, 13.56 megahertz (MHz), 27 MHz, 2 MHz, 60 MHz, 400 kilohertz (kHz), 2.54 gigahertz (GHz), or combinations thereof. Plasma power supply 806 and wafer bias voltage power supply 816 may be appropriately sized to supply a range of powers in order to achieve the desired process performance. For example, in one embodiment, the plasma power supply 806 may supply the power in a range of 50 to 5000 Watts, and the wafer bias voltage power supply 816 may supply a bias voltage in a range of 20 to 2000 V. In addition, the TCP coil 810 and/or the electrode 820 may be comprised of two or more sub-coils or sub-electrodes. The sub-coils or sub-electrodes may be powered by a single power supply or powered by multiple power supplies.

As shown in FIG. 8, the plasma processing chamber system 800 further includes a gas source/gas supply mechanism 830. The gas source 830 is in fluid connection with plasma processing confinement chamber 804 through a gas inlet, such as a gas injector 840. The gas injector 840 may be located in any advantageous location in the plasma processing confinement chamber 804 and may take any form for injecting gas. Preferably, however, the gas inlet may be configured to produce a "tunable" gas injection profile. The tunable gas injection profile allows independent adjustment of the respective flow of the gases to multiple zones in the plasma process confinement chamber 804. More preferably, the gas injector is mounted to the dielectric inductive power window 812. The gas injector may be mounted on, mounted in, or form part of the power window. The process gases and by-products are removed from the plasma process confinement chamber 804 via a pressure control valve 842 and a pump 844. The pressure control valve 842 and pump 844 also serve to maintain a particular pressure within the plasma processing confinement chamber 804. The pressure control valve 842 can maintain a pressure of less than 1 torr during processing. An edge ring 860 is placed around the substrate 866. The gas source/gas supply mechanism 830 is controlled by the controller 824. For example, a Kiyo® tool made by Lam Research Corp. of Fremont, CA, may be used to practice an embodiment.

Figure 9:
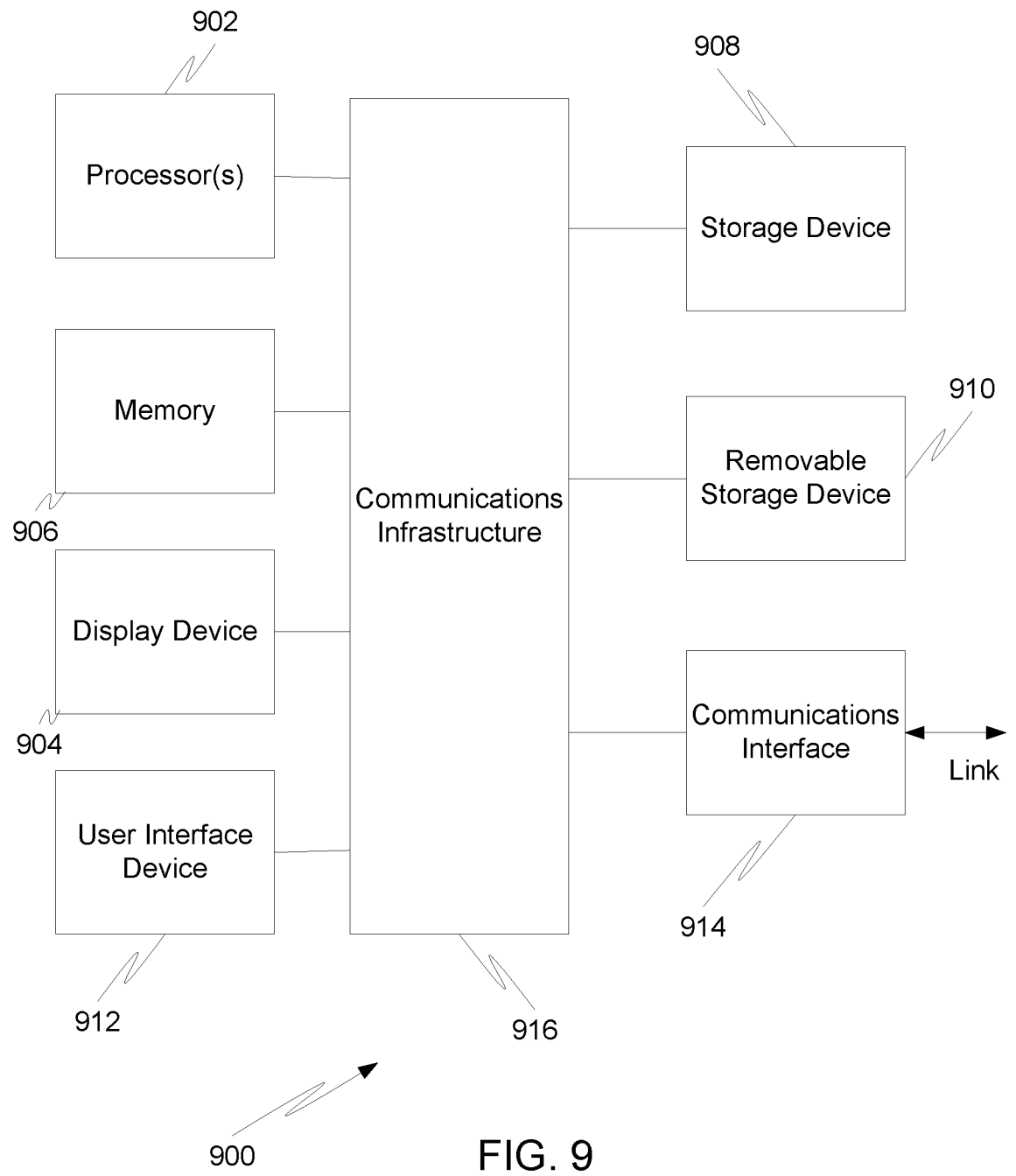
FIG. 9 is a schematic view of a computer system that may be used in practicing an embodiment.

FIG. 9 is a high level block diagram showing a computer system 900. The computer system 900 is suitable for implementing a controller 824 used in embodiments. The computer system 900 may have many physical forms ranging from an integrated circuit, a printed circuit board, and a small handheld device up to a huge supercomputer. The computer system 900 includes one or more processors 902, and further can include an electronic display device 904 (for displaying graphics, text, and other data), a main memory 906 (e.g., random access memory (RAM)), storage device 908 (e.g., hard disk drive), removable storage device 910 (e.g., optical disk drive), user interface devices 912 (e.g., keyboards, touch screens, keypads, mice or other pointing devices, etc.), and a communications interface 914 (e.g., wireless network interface). The communications interface 914 allows software and data to be transferred between the computer system 900 and external devices via a link. The system may also include a communications infrastructure 916 (e.g., a communications bus, cross-over bar, or network) to which the aforementioned devices/modules are connected.

Information transferred via communications interface 914 may be in the form of signals such as electronic, electromagnetic, optical, or other signals capable of being received by communications interface 914, via a communications link that carries signals and may be implemented using wire or cable, fiber optics, a phone line, a cellular phone link, a radio frequency link, and/or other communications channels. With such a communications interface 914, it is contemplated that the one or more processors 902 might receive information from a network or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer readable code include machine code, such as produced by a compiler, and files containing higher level code that are executed by a computer using an interpreter. Computer readable media may also be computer code transmitted by a computer data signal a processor.

In some embodiments, the computer readable media may comprise computer readable code for transferring a stack to the plasma processing chamber system 800, computer readable code for forming a metal halide (step 104), computer readable code for forming a metal halide ligand complex (step 108), computer readable code for vaporizing the metal halide ligand complex (step 112).

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for etching a metal containing material, comprising:
   exposing the metal-containing material to a halogen containing fluid or plasma to convert at least some of the metal containing material into a metal halide material;
   exposing the metal halide material to a ligand containing fluid or plasma, wherein at least some of the metal halide material is formed into a metal halide ligand complex; and
   vaporizing at least some of the metal halide ligand complex, wherein the exposing the metal containing material to the halogen containing fluid or plasma and the exposing the metal halide material to the ligand containing fluid or plasma are performed simultaneously, and wherein the halogen containing fluid is different from the ligand containing fluid.

2. The method, as recited in claim 1, wherein the exposing the metal halide material to the ligand containing plasma, comprises:
   providing a ligand containing fluid; and
   forming a plasma from the ligand containing fluid.

3. The method of claim 2, wherein the ligand containing fluid comprises a ligand containing gas or vapor comprising at least one of $H_2O$, CO, $CO_2$, $CH_3OH$, OH, $NH_3$, $PF_3$, and $PCl_3$.

4. The method, as recited in claim 1, wherein the exposing the metal containing material to the halogen containing fluid or plasma, comprises:
   providing a halogen containing gas; and
   forming a plasma from the halogen containing gas.

5. The method of claim 4, wherein the halogen containing gas comprises at least one of $NF_3$, $Cl_2$, HBr, $BCl_3$, $Br_2$, and $SF_6$.

6. The method, as recited in claim 1, wherein the metal containing material comprises at least one of Fe, Ni, Cr, In, Pt, Pd, Co, and another transition metal.

7. The method, as recited in claim 1, further comprising heating the metal halide ligand complex to a temperature above 120° C. to vaporize the metal halide ligand complex.

8. The method, as recited in claim 1, further comprising providing a pressure in a range of about 1 millitorr (mTorr) and about 500 mTorr.

9. The method, as recited in claim 1, wherein the metal containing material is a metal containing residue on parts of a processing chamber.

10. The method, as recited in claim 9, wherein the exposing the metal containing material to the halogen containing fluid or plasma and the exposing the metal halide material to the ligand containing fluid or plasma are performed during a chamber cleaning process.

11. The method, as recited in claim 1, wherein the exposing the metal containing material to the halogen containing fluid or plasma and the exposing the metal halide material to the ligand containing fluid or plasma provide an isotropic etch of the metal containing material.

12. The method, as recited in claim 1, wherein the exposing the metal containing material to the halogen containing fluid or plasma and the exposing the metal halide material to the ligand containing fluid or plasma provide a patterned etch.

13. A magnetic random access memory stack etched according to the method as recited in claim 1.

14. The method, as recited in claim 1, wherein the metal containing material comprises at least one of Ni, Cr, In, Ti, Ta, Mg, W, Mo, Hf, and Al.

15. The method, as recited in claim 1, wherein the halogen containing fluid or plasma comprises at least one of fluorine, bromine, and iodine.

16. A method for etching a metal containing material, comprising:
   exposing the metal containing material to an etching fluid or plasma comprising phosphorous and chlorine to form the metal into at least one complex of a metal phosphorous chloride ligand complex, wherein the exposing the metal containing material to the etching fluid or plasma, comprises:
   providing an etching fluid, wherein the etching fluid comprises $PCl_5$; and
   forming the etching fluid into a plasma; and
   vaporizing at least some of the metal phosphorous chloride ligand complex.

17. The method, as recited in claim 16, wherein the at least one complex of the metal phosphorous chloride ligand complex comprises $M(PCl_3)xCl_2$, where M is a metal and x is an integer between 1 and 6 inclusive.

18. A method for etching a metal containing material, comprising:
   exposing the metal-containing material to a halogen containing fluid or plasma to convert at least some of the metal containing material into a metal halide material;
   exposing the metal halide material to a ligand containing fluid or plasma, wherein at least some of the metal halide material is formed into a metal halide ligand complex; and
   vaporizing at least some of the metal halide ligand complex, wherein the halogen containing fluid or plasma comprises $NF_3$ and wherein the ligand containing fluid comprises a ligand containing gas or vapor comprising at least one of PCl$_5$, and PCl$_3$.

19. The method of claim 18, wherein the exposing the metal containing material to the halogen containing fluid or plasma and the exposing the metal halide material to the ligand containing fluid or plasma are performed sequentially for a plurality of cycles.

\* \* \* \* \*